(12) United States Patent
Kim et al.

(10) Patent No.: US 12,509,392 B2
(45) Date of Patent: Dec. 30, 2025

(54) COVER WINDOW MANUFACTURING SYSTEM AND METHOD FOR MANUFACTURING COVER WINDOW

(71) Applicant: SAMSUNG DISPLAY CO., LTD., Yongin-si (KR)

(72) Inventors: Kyung Man Kim, Anyang-si (KR); Sung Hoon Kim, Asan-si (KR); Da Woon Kim, Yongin-si (KR); Yu Ri Kim, Guri-si (KR); Seong Jin Hwang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 703 days.

(21) Appl. No.: 17/721,485

(22) Filed: Apr. 15, 2022

(65) Prior Publication Data
US 2022/0411325 A1 Dec. 29, 2022

(30) Foreign Application Priority Data

Jun. 25, 2021 (KR) ................. 10-2021-0082842

(51) Int. Cl.
C03C 23/00 (2006.01)
C03C 15/00 (2006.01)
H05K 5/03 (2006.01)

(52) U.S. Cl.
CPC .......... *C03C 23/0025* (2013.01); *C03C 15/00* (2013.01); *H05K 5/03* (2013.01)

(58) Field of Classification Search
CPC ............................ C03C 23/0025; C03C 15/00
See application file for complete search history.

(56) References Cited

U.S. PATENT DOCUMENTS

| 4,631,114 | A | * | 12/1986 | Schneider | ............... | C03C 15/00 |
| | | | | | | 216/97 |
| 6,795,274 | B1 | * | 9/2004 | Hsieh | ................... | G11B 5/8404 |
| | | | | | | 219/121.72 |
| 9,346,706 | B2 | | 5/2016 | Bazemore et al. | | |
| 9,403,711 | B2 | | 8/2016 | Roh | | |

(Continued)

FOREIGN PATENT DOCUMENTS

JP 2019-206460 A2 12/2019
KR 10-2014-0146836 A 12/2014

(Continued)

OTHER PUBLICATIONS

Office Action issued on Mar. 20, 2025 in corresponding application No. KR 10-2021-0082842.

*Primary Examiner* — Erin Snelting
(74) *Attorney, Agent, or Firm* — F. CHAU & ASSOCIATES, LLC

(57) ABSTRACT

A cover window manufacturing system comprises a laser irradiation apparatus including a stage configured to receive a substrate. A first laser module is disposed above the stage to provide a first laser beam to a top surface of the substrate. A controller controls a position of a focal point of the first laser beam on the substrate. An etching apparatus includes a chamber having an etching solution disposed therein. The etching apparatus is configured to receive the substrate processed by the laser irradiation apparatus and etch the substrate processed by the laser irradiation apparatus by immersion in the etching solution.

9 Claims, 19 Drawing Sheets

(56) References Cited

U.S. PATENT DOCUMENTS

| | | |
|---|---|---|
| 9,656,910 B2 | 5/2017 | Bazemore et al. |
| 10,179,747 B2 | 1/2019 | Roh |
| 2019/0329251 A1* | 10/2019 | Ortner .................. B23K 26/364 |
| 2021/0114925 A1 | 4/2021 | Park et al. |
| 2022/0193825 A1* | 6/2022 | Van Dyke ............... C03B 33/04 |

FOREIGN PATENT DOCUMENTS

| | | |
|---|---|---|
| KR | 10-1501427 | 3/2015 |
| KR | 10-2016-0014571 A | 2/2016 |
| KR | 10-2019-0125224 | 11/2019 |
| KR | 10-2020-0128318 | 11/2020 |
| KR | 10-2021-0010911 | 1/2021 |
| KR | 10-2021-0048000 A | 5/2021 |

\* cited by examiner

SS: LS1, LS2, SS1, SS2, CS1, CS2, CS3, CS4

FP: FP1, FP2

FL_1: FL1, FL2, FL3, FL4, FL5_1, FL6_1, FL7_1, FL8_1
PA: LS1a, LS2a, SS1a, SS2a, CS1a, CS2a, CS3a, CS4a

COVER WINDOW MANUFACTURING SYSTEM AND METHOD FOR MANUFACTURING COVER WINDOW

CROSS-REFERENCE TO RELATED APPLICATION

This application claims priority under 35 U.S.C. § 119 to Korean Patent Application No. 10-2021-0082842, filed on Jun. 25, 2021 in the Korean Intellectual Property Office, the disclosure of which is incorporated by reference in its entirety herein.

1. TECHNICAL FIELD

The present disclosure relates to a cover window manufacturing system and a method for manufacturing a cover window.

2. DISCUSSION OF RELATED ART

Display devices have become increasingly important with the development of multimedia technology. Accordingly, various types of display devices such as a liquid crystal display (LCD) device, an organic light emitting display (OLED) device and the like have been developed.

A display device may include a cover window to protect a display panel.

SUMMARY

Aspects of the present disclosure provide a cover window manufacturing system and a method for manufacturing a cover window, capable of manufacturing a cover window including a round edge through a precise processing method.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment, a cover window manufacturing system comprises a laser irradiation apparatus including a stage configured to receive a substrate. A first laser module is disposed above the stage to provide a first laser beam to a top surface of the substrate. A controller controls a position of a focal point of the first laser beam on the substrate. An etching apparatus includes a chamber having an etching solution disposed therein. The etching apparatus is configured to receive the substrate processed by the laser irradiation apparatus and etch the substrate processed by the laser irradiation apparatus by immersion in the etching solution.

According to an embodiment, a method for manufacturing a cover window comprises preparing a substrate. A laser beam is irradiated on the substrate while adjusting a position of a focal point of the laser beam on the substrate according to a processing shape. The substrate irradiated by the laser beam is etched.

According to the cover window manufacturing system and the method for manufacturing a cover window according to an embodiment, the manufacturing cost of the cover window may be reduced. In addition, a defect rate in manufacturing a cover window may be reduced through an increase in the precision of the manufacturing process.

However, the effects of embodiments of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF EMBODIMENTS

Figure 1:
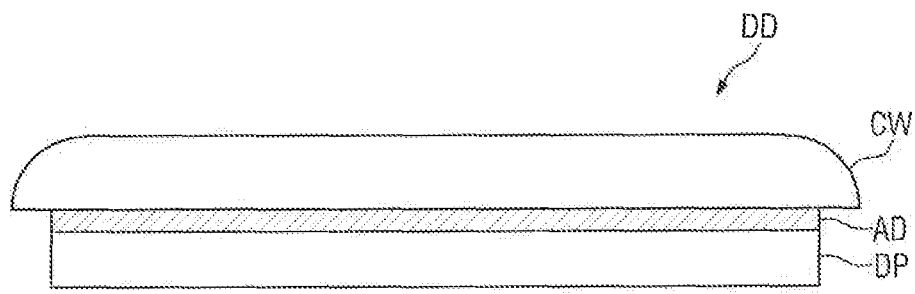
FIG. 1 is a cross-sectional view of a display device according to an embodiment of the present disclosure.

Specific structural and functional descriptions of embodiments of the present disclosure are only for illustrative purposes. The invention may be embodied in many different forms without departing from the spirit and significant characteristics of the present disclosure. Therefore, the embodiments of the present disclosure are disclosed only for illustrative purposes and should not be construed as limiting the invention.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe the relationship of one element to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross-sectional illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present disclosure.

Hereinafter, embodiments will be described in detail with reference to the accompanying drawings.

FIG. 1 is a schematic cross-sectional view of a display device according to an embodiment.

Referring to FIG. 1, in an embodiment, a display device DD may include a display panel DP, a cover window CW disposed on the display panel DP and an adhesive layer AD disposed between the display panel DP and the cover window CW to bond the display panel DP with the cover window CW.

Examples of the display panel DP may include not only a self-light emitting display panel such as an organic light emitting display (OLED) panel, an inorganic electroluminescence (EL) display panel, a quantum dot light emitting display (QED) panel, a micro-LED display panel, a nano-LED display panel, a plasma display panel (PDP), a field emission display (FED) panel and a cathode ray tube (CRT) display panel, but also a light receiving display panel such as a liquid crystal display (LCD) panel and an electrophoretic display (EPD) panel. However, embodiments of the present disclosure are not limited thereto.

The display panel DP may include a plurality of pixels and display an image by using light emitted from, or received by, each pixel.

The cover window CW may be disposed on the display panel DP. The cover window CW may serve to protect the display panel DP. The cover window CW may transmit the light emitted from the display panel DP. For example, in an embodiment, the cover window CW may be made of transparent glass. However, embodiments of the present disclosure are not limited thereto.

In an embodiment, the cover window CW may be larger in size (e.g., an area in a top plan view) than the display panel DP and the side surface of the cover window CW may protrude outward from the side surface of the display panel DP. However, embodiments of the present disclosure are not limited thereto. In an embodiment, the display device DD may further include a printed layer disposed on at least one surface of the cover window CW at an edge portion of the cover window CW. The printed layer may prevent the bezel area of the display device DD from being visible from the outside by a user, and may also increase the aesthetic appeal of the display device DD in some embodiments.

The adhesive layer AD is disposed between the display panel DP and the cover window CW (e.g., in a thickness direction of the display device DD). The adhesive layer AD may fix the cover window CW to the display panel DP. In an embodiment, the adhesive layer AD may include an optically clear adhesive (OCA), an optically clear resin (OCR), or the like. However, embodiments of the present disclosure are not limited thereto.

Hereinafter, the above-described cover window CW according to an embodiment of the present disclosure will be described in more detail.

Figure 2:
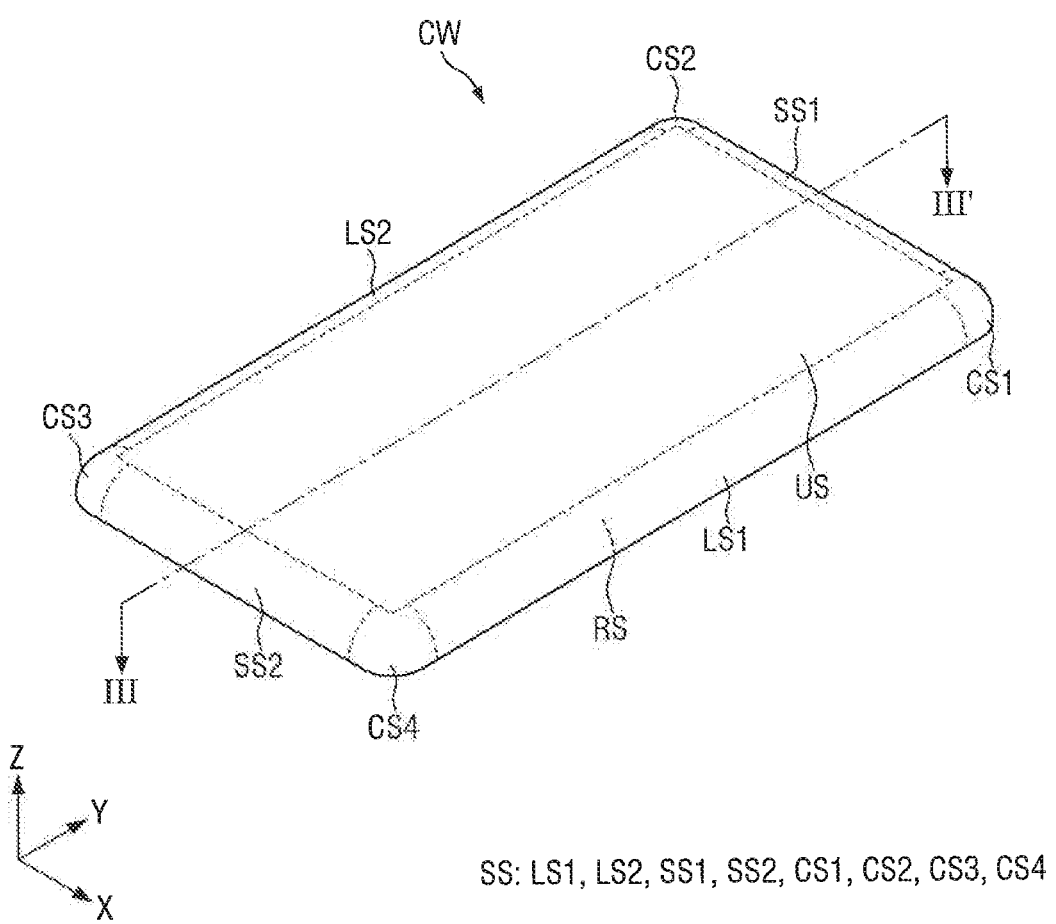
FIG. 2 is a perspective view of a cover window according to an embodiment of the present disclosure.
Figure 3:
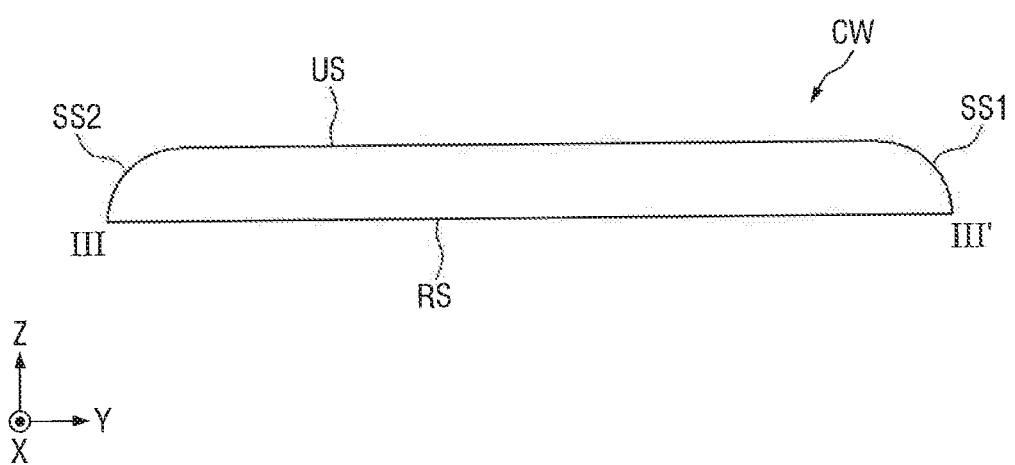
FIG. 3 is a cross-sectional view taken along line III-III' of FIG. 2 according to an embodiment of the present disclosure.

FIG. 2 is a perspective view of a cover window according to an embodiment. FIG. 3 is a cross-sectional view taken along line III-III' of FIG. 2.

Referring to FIGS. 2 and 3, the cover window CW according to an embodiment may have a three-dimensional shape including a curved portion. The cover window CW may include a first surface US located on a first side in a third direction Z, a second surface RS facing the first surface US and located on the opposite second side in the third direction Z, and side surfaces SS connecting the first surface US to the second surface RS in side regions.

In an embodiment, the first surface US may be disposed in a direction in which the light provided from the display panel DP is emitted, and the second surface RS may be disposed in a direction opposite to the direction in which the light provided from the display panel DP is emitted. In an embodiment, the first surface US and the second surface RS may be parallel to each other. In an embodiment, the area of the first surface US (e.g., in a plane defined in a first direction X and a second direction Y) may be less than the area of the second surface RS (e.g., in a plane defined in the X and Y directions).

The side surfaces SS may be disposed around the first surface US (e.g., in the X and/or Y directions). The side surface SS may include a curved surface. The inclination angle of each of the side surfaces SS may be different with respect to each of the first surface US and the second surface RS. The inclination angle of the side surface SS measured with respect to the first surface US may be defined as an angle formed by each tangent plane at a point where the first surface US and the side surface SS meet. The inclination angle of the side surface SS measured with respect to the second surface RS may be defined as an angle formed by each tangent plane at a point where the second surface RS and the side surface SS meet. For example, in an embodiment, the side surface SS may have an inclination angle that is obtuse with respect to the first surface US, and have an inclination angle that is acute with respect to the second surface RS. However, embodiments of the present disclosure are not limited thereto. For example, in an embodiment, the side surface SS may have an inclination angle of an obtuse angle with respect to the first surface US, but may also have an inclination angle of a right angle or an obtuse angle with respect to the second surface RS.

The side surface SS may include a first long side surface LS1 disposed on a first side of the first surface US in the first direction X, a second long side surface LS2 disposed on an opposite second side of the first surface US in the first direction X, a first short side surface SS1 disposed on a first side of the first surface US in the second direction Y, and a second short side surface SS2 disposed on an opposite second side of the first surface US in the second direction Y. However, embodiments of the present disclosure are not limited thereto and the numbers of the short side surfaces and long side surfaces and the arrangement thereof may vary.

The first long side surface LS1 and the second long side surface LS2 may have a shape extending in the second direction Y. The first long side surface LS1 and the second long side surface LS2 may face each other in (e.g., be arranged in) the first direction X. The first short side surface SS1 and the second short side surface SS2 may have a shape extending in the first direction X. The first short side surface SS1 and the second short side surface SS2 may face each other in (e.g., be arranged in) the second direction Y.

The side surface SS may further include a first corner side surface CS1 disposed between the first long side surface LS1 and the first short side surface SS1, a second corner side surface CS2 disposed between the first short side surface SS1 and the second long side surface LS2, a third corner side surface CS3 disposed between the second long side surface LS2 and the second short side surface SS2 and a fourth corner side surface CS4 disposed between the second short side surface SS2 and the first long side surface LS1.

The first corner side surface CS1 may surround the corner of the first surface US on a first side in the first direction X and a first side in the second direction Y. The second corner side surface CS2 may surround the corner of the first surface US on an opposite second side in the first direction X and the first side in the second direction Y. The third corner side surface CS3 may surround the corner of the first surface US on the second side in the first direction X and an opposite second side in the second direction Y. The fourth corner side surface CS4 may surround the corner of the first surface US on the first side in the first direction X and the second side in the second direction Y.

A cover window manufacturing system 1 according to an embodiment to be described later may be a manufacturing facility for manufacturing the cover window CW having a shape described above. For example, the cover window manufacturing system 1 to be described later may process an edge portion of a flat substrate G to form a curved side surface.

Figure 4:
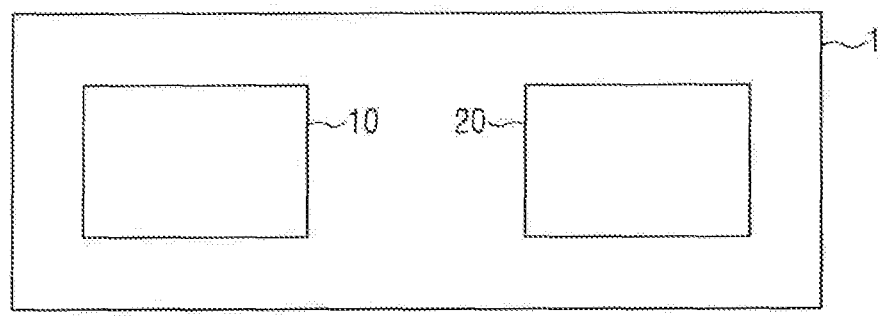
FIG. 4 is a block diagram illustrating a cover window manufacturing system according to an embodiment of the present disclosure.
Figure 5:
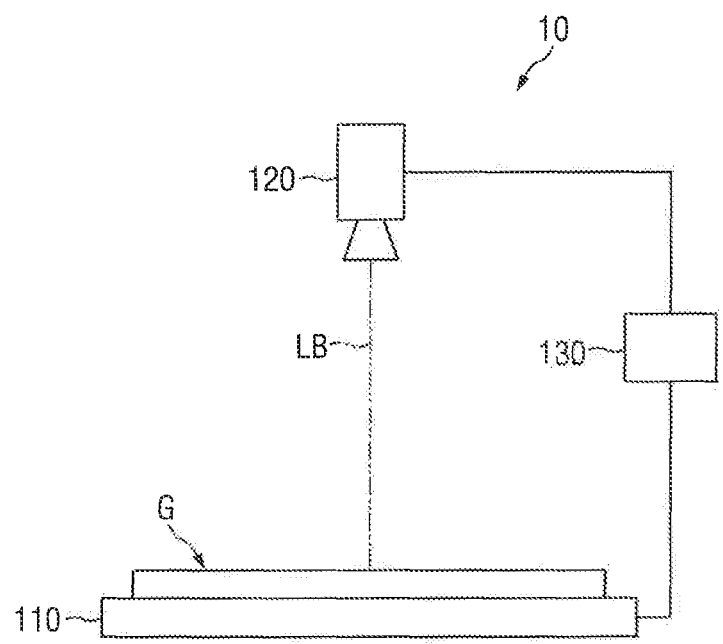
FIG. 5 is an elevational view illustrating a laser irradiation apparatus included in a cover window manufacturing system according to an embodiment of the present disclosure.
Figure 6:
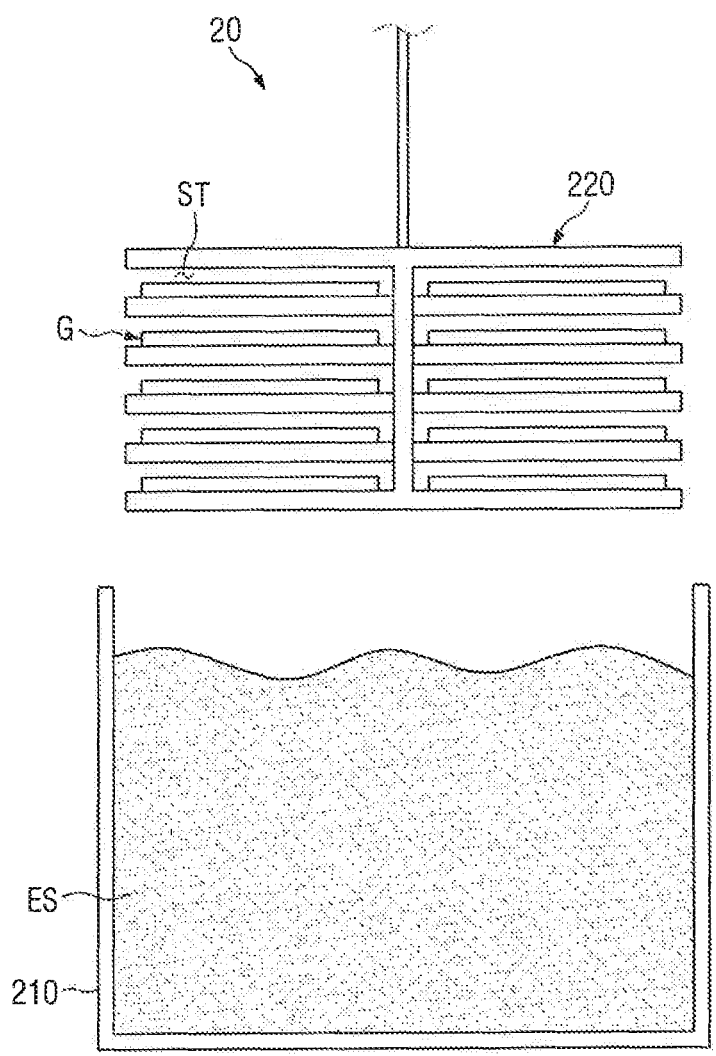
FIG. 6 is an elevational view illustrating an etching apparatus included in a cover window manufacturing system according to an embodiment of the present disclosure.

FIG. 4 is a block diagram illustrating a cover window manufacturing system according to an embodiment. FIG. 5 is a schematic view illustrating a laser irradiation apparatus included in a cover window manufacturing system according to an embodiment. FIG. 6 is a schematic view illustrating an etching apparatus included in a cover window manufacturing system according to an embodiment.

Referring to FIGS. 4 to 6, the cover window manufacturing system 1 according to an embodiment may include a laser irradiation apparatus 10 and an etching apparatus 20. The cover window manufacturing system 1 according to an embodiment may be an equipment system for making the substrate G (FIG. 5) into the cover window CW. After being processed by the laser irradiation apparatus 10, the substrate G may be etched by the etching apparatus 20.

As shown in FIG. 5, the laser irradiation apparatus 10 according to an embodiment may include a stage 110 providing a space where the substrate G is disposed thereon (e.g., received thereon), a laser module 120 for irradiating a laser beam LB towards the substrate G disposed on the stage 110, and a controller 130 for controlling the position and the movement of the laser module 120. Details of the laser irradiation apparatus 10 according to an embodiment and a laser irradiation process using the same will be described later with reference to FIGS. 7 to 10.

The etching apparatus 20 according to an embodiment may include a chamber 210 for accommodating an etching solution ES therein and a substrate carrier 220 for accommodating the substrate G in an etching process. For example, in an embodiment, after using the laser irradiation apparatus 10 to irradiate the laser beam LB onto the substrate G, the substrate G irradiated with the laser beam LB may be accommodated in the substrate carrier 220 and the substrate carrier 220 accommodating the substrate G may be immersed in the etching solution ES in the chamber 210 to process the substrate G. In an embodiment, the etching solution ES may include a potassium hydroxide (KOH) solution or a hydrogen fluoride (HF) solution. However, embodiments of the present disclosure are not limited thereto and the composition of the etching solution ES may vary.

Details of the etching apparatus 20 according to an embodiment and an etching process using the same will be described later with reference to FIGS. 12 to 15.

Figure 7:
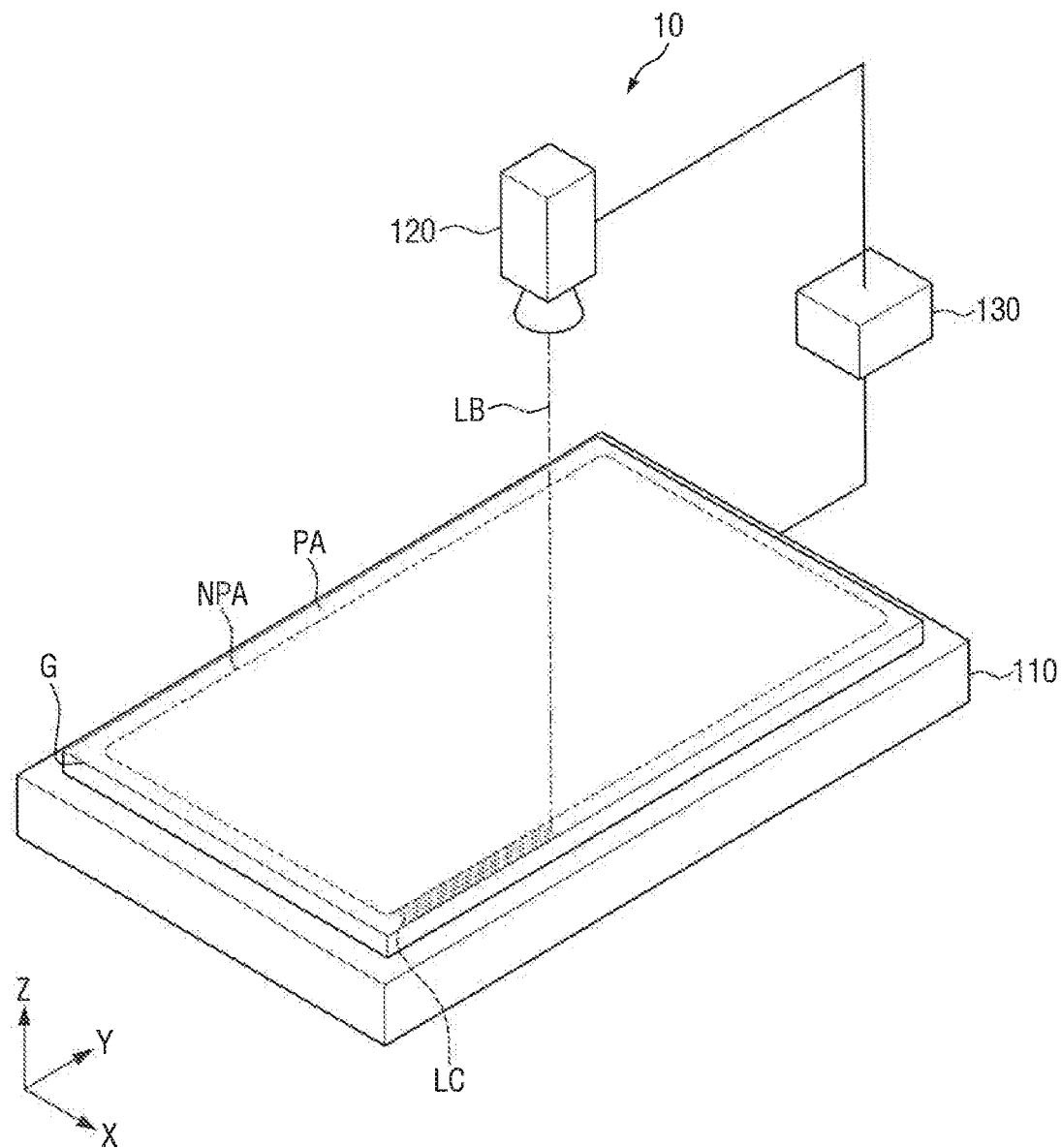
FIG. 7 is a perspective view illustrating a laser irradiation apparatus according to an embodiment of the present disclosure.
Figure 8:
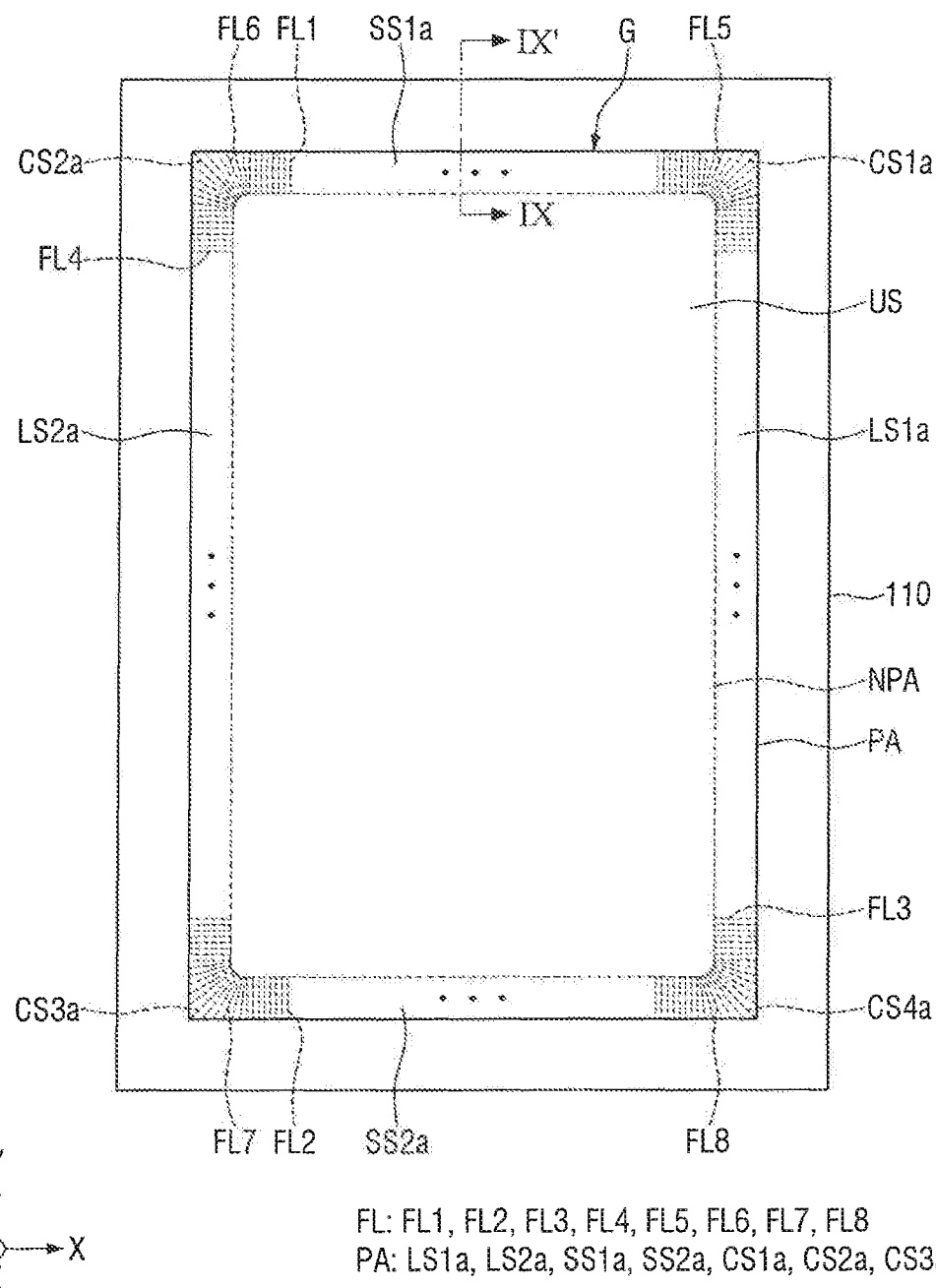
FIG. 8 is a plan view illustrating a substrate to which a laser beam is irradiated through a laser irradiation apparatus according to an embodiment of the present disclosure.
Figure 9:
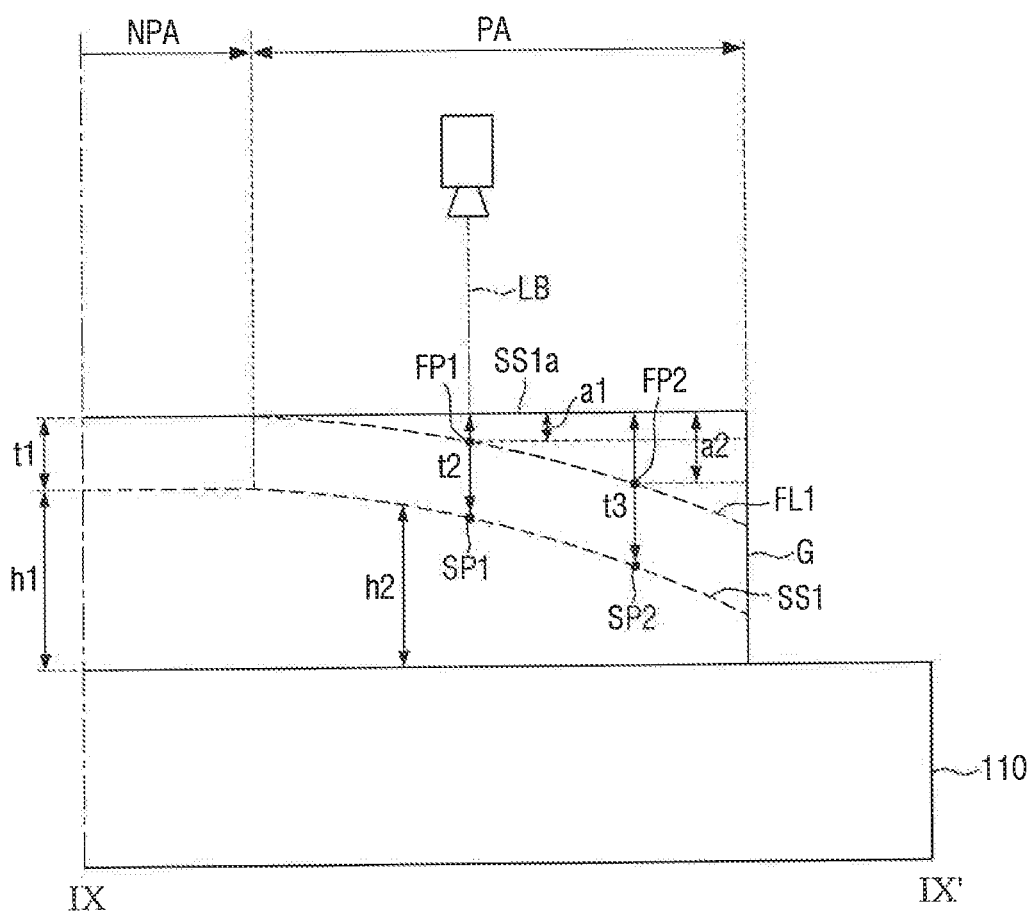
FIG. 9 is a cross-sectional view taken along line IX-IX' of FIG. 8 according to an embodiment of the present disclosure.
Figure 9:
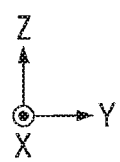

FIG. 7 is a perspective view illustrating a laser irradiation apparatus according to an embodiment. FIG. 8 is a plan view illustrating a substrate to which a laser beam is irradiated through a laser irradiation apparatus according to an embodiment. FIG. 9 is a cross-sectional view taken along line IX-IX' of FIG. 8.

Referring to FIGS. 7 and 8, the laser irradiation apparatus 10 according to an embodiment may irradiate the laser beam LB onto the substrate G. In an embodiment, the substrate G may have a rectangular parallelepiped shape. In an embodiment, the thickness of the substrate G may be substantially constant for each region. In an embodiment, the lower side surface of the substrate G in the third direction Z may be in direct contact with the stage 110. In an embodiment, the upper side surface and the lower side surface of the substrate G in the third direction Z may be parallel to each other and be flat.

The substrate G may be disposed on the stage 110. In an embodiment, the stage 110 may provide position information of the substrate G disposed on the stage 110 to the controller 130. The controller 130 may determine an irradiation position of the laser beam LB based on the position information of the substrate G.

The laser module 120 may irradiate the laser beam LB toward the stage 110. For example, the laser module 120 may be disposed above the stage 110 and may irradiate the laser beam LB towards a top surface of the substrate G disposed on the stage 110. In an embodiment, the irradiation of the laser beam LB by the laser module 120 and the position of a focal point FP (FIG. 9) of the laser beam LB may be controlled by the controller 130. In an embodiment, when the laser module 120 irradiates the laser beam LB onto one surface of the substrate G, a fine crack LC may be formed in the region where the laser beam LB is irradiated in the substrate G.

The controller 130 may control the laser beam LB which the laser module 120 irradiates. For example, the controller 130 may control the irradiation of the laser beam LB in an "on"/"off" manner. Also, the controller 130 may control the position of the focal point FP of the laser beam LB. For example, the controller 130 may control the position of the focal point FP of the laser beam LB in the first direction X and the second direction Y. In addition, the controller 130 may control the position of the focal point FP of the laser beam LB in the third direction Z which is the thickness direction of the substrate G. For example, the controller 130 may control the position of the focal point FP of the laser beam LB in the substrate G in the third direction Z to adjust the etching amount.

Hereinafter, there will be described a process of using the laser irradiation apparatus 10 according to an embodiment to process the edge portion of the substrate G while controlling the position of the focal point FP of the laser beam LB with the controller 130.

The substrate G may include a processing area PA to which the laser beam LB is irradiated and a non-processing area NPA to which the laser beam LB is not irradiated. As shown in FIG. 7, in an embodiment, the processing area PA may be positioned around the non-processing area NPA (e.g., in the X and/or Y directions). The processing area PA may be disposed to surround the non-processing area NPA. For example, the processing area PA may completely surround the non-processing area NPA (e.g., in the X and/or Y directions). However, embodiments of the present disclosure are not limited thereto and the processing area PA may not surround at least one edge of the non-processing area NPA in some embodiments.

The non-processing area NPA may be substantially the same as the first surface US described above with reference to FIG. 2. For example, the flatness of the non-processing area NPA may be maintained even after the laser beam LB irradiation and the etching process are performed.

The processing area PA may be processed through the etching process after the laser beam LB is irradiated, and thus may be changed to the side surfaces SS described above with reference to FIG. 2. In an embodiment, the processing area PA may include a first long surface LS1a disposed at a first side of the non-processing area NPA in the first direction X, a second long surface LS2a disposed at an opposite second side thereof in the first direction X, a first short surface SS1a disposed at a first side in the second direction Y and a second short surface SS2a disposed at an opposite second side in the second direction Y.

The first long surface LS1a and the second long surface LS2a may face each other with the first surface US interposed therebetween and may have a shape extending in the second direction Y. The first short surface SS1a and the second short surface SS2a may face each other with the first surface US interposed therebetween and may have a shape extending in the first direction X.

The processing area PA may further include a first corner surface CS1a disposed between the first long surface LS1a and the first short surface SS1a, a second corner surface CS2a disposed between the first short surface SS1a and the second long surface LS2a, a third corner surface CS3a disposed between the second long surface LS2a and the second short surface SS2a, and a fourth corner surface CS4a disposed between the second short surface SS2a and the first long surface LS1a.

The first corner surface CS1a may be disposed at a corner of the first surface US on a first side in the first direction X and a first side in the second direction Y, the second corner surface CS2a may be disposed at a corner of the first surface US on an opposite second side in the first direction X and the first side in the second direction Y, the third corner surface CS3a may disposed at a corner of the first surface US on the second side in the first direction X and an opposite second side in the second direction Y, and the fourth corner surface CS4a may be disposed at a corner of the first surface US on the first side in the first direction X and the second side in the second direction Y.

The laser beam LB may be irradiated to the processing area PA. In an embodiment, the laser beam LB may be irradiated while moving along a specific irradiation line in a plan view. The irradiation line may be an imaginary line through which the focal point FP of the laser beam LB passes. In an embodiment, the laser beam LB may be irradiated while moving toward the edge of the substrate G from the boundary between the processing area PA and the non-processing area NPA.

For example, in the first short surface SS1a, the laser beam LB may be irradiated while moving along the first irradiation line FL1 from the first surface US to a first side in the second direction Y in plan view. In the second short surface SS2a, the laser beam LB may be irradiated while moving along a second irradiation line FL2 from the first surface US to the second side in the second direction Y in plan view. In the first long surface LS1a, the laser beam LB may be irradiated while moving along a third irradiation line FL3 from the first surface US to a first side in the first direction X in plan view. In the second long surface LS2a, the laser beam LB may be irradiated while moving along a fourth irradiation line FL4 from the first surface US to the second side in the first direction X in plan view.

In addition, in the first corner surface CS1a, the laser beam LB may be irradiated while moving along a fifth irradiation line FL5 from the first surface US to a direction between a first side in the first direction X and a first side in the second direction Y in a plan view. In the second corner surface CS2a, the laser beam LB may be irradiated while moving along a sixth irradiation line FL6 from the first surface US to a direction between the second side in the first direction X and the first side in the second direction Y in a plan view. In the third corner surface CS3a, the laser beam LB may be irradiated while moving along a seventh irradiation line FL7 from the first surface US to a direction between the second side in the first direction X and the second side in the second direction Y in a plan view. In the fourth corner surface CS4a, the laser beam LB may be irradiated while moving along an eighth irradiation line FL8 from the first surface US to a direction between the first side in the first direction X and the second side in the second direction Y in a plan view.

The focal point FP of the laser beam LB may move along a desired processing shape. For example, in an embodiment, the focal point FP of the laser beam LB may move towards the lower side in the third direction Z as the laser beam LB moves from the first surface US to an edge of the substrate G to manufacture the cover window CW in the shape as illustrated in FIGS. 2 and 3.

In an embodiment, after irradiation of the laser beam LB, the substrate G may be immersed in the etching solution ES to perform an etching process. In the etching process, in the substrate G, the etching amounts of the processing area PA to which the laser beam LB is irradiated and the non-processing area NPA to which the laser beam LB is not irradiated may be different from each other. The etching amount of the substrate G may mean a thickness difference of the substrate G in the third direction Z which changes before an etching process and after the etching process is completed. For example, the etching selectivity of the substrate G may vary depending on whether the laser beam LB is irradiated or not. In an embodiment, the etching amount of the processing area PA to which the laser beam LB is irradiated may be greater than the etching amount of the non-processing area NPA to which the laser beam LB is not irradiated.

In addition, the etching amount may vary according to the position of the focal point FP of the irradiated laser beam LB even within the processing area PA. For example, as the focal point FP of the laser beam LB is positioned closer to the lower side of the third direction Z in the substrate G, the etching amount may increase in the subsequent etching process. For example, the etching amount that is obtained in the subsequent etching process increases the deeper (e.g., the closer to the lower side of the substrate G) that the focal point FP of the laser beam LB is located in the substrate G.

The correlation between the focal point FP of the laser beam LB and the etching amount in the subsequent etching process will be described in detail with reference to FIG. 9. FIG. 9 is a cross-sectional view taken along line IX-IX' of FIG. 8. The cutting line IX-IX' may be a line cut in a direction parallel to the second direction Y.

FIG. 9 is a schematic view of a process of irradiating the laser beam LB to the first short surface SS1a of the substrate G along the first irradiation line FL1. Hereinafter, although the description is directed to an embodiment in which the laser beam LB is irradiated to the first short surface SS1a shown in FIG. 9 for economy of description, the same description may be applied to the cases of irradiating the laser beam LB to the second short surface SS2a, the first long surface LS1a, the second long surface LS2a, the first corner surface CS1a, the second corner surface CS2a, the third corner surface CS3a, and the fourth corner surface CS4a.

Referring to FIG. 9, the laser beam LB may be irradiated onto the first short surface SS1a of the substrate G. For example, the focal point FP of the laser beam LB may be located inside the substrate G. In the first short surface SS1a, the laser beam LB may be irradiated while the focal point FP moves along the first irradiation line FL1. The first irradiation line FL1 may move towards the lower side in the third direction Z as it goes towards the first side in the second direction Y. When the laser beam LB is irradiated, the fine crack LC may be formed on the first short surface SS1a.

When the etching process is performed after the laser beam LB is irradiated onto the first short surface SS1a, the substrate G may be partially etched to form the first short side surface SS1. The first short side surface SS1 may be disposed further towards the lower side of the third direction Z than the first irradiation line FL1. For example, the first irradiation line FL1 may be disposed between the first short surface SS1a and the first short side surface SS1.

In the substrate G, the processing area PA to which the laser beam LB is irradiated may be etched more through the subsequent etching process than the non-processing area NPA to which no laser beam LB is irradiated. For example, as shown in FIG. 9, the non-processing area NPA of the substrate G may be etched from the first short surface SS1a towards the lower side in the third direction Z by a first depth t1. The processing area PA thereof may be etched from the first short surface SS1a to the lower side in the third direction Z by a second depth t2 which is greater than the first depth t1. Accordingly, a thickness h1 (e.g., length in the Z direction) of the non-processing area NPA in the substrate G may be greater than a thickness h2 (e.g., length in the Z direction) of the processing area PA.

In an embodiment, the etching depth of the substrate G may be greater than the penetration depth of the focal point FP of the laser beam LB in the substrate G. For example, when the focal point FP of the laser beam LB is formed at a first focal point FP1 located at a first focal depth a1 from the first short surface SS1a towards the lower side in the third direction Z, the corresponding region may be etched from the first short surface SS1a towards the lower side in the third direction Z through the subsequent etching process, up to a first point SP1 having a second depth t2 greater than the first focal depth a1.

The deeper the focal point FP of the laser beam LB is located in the substrate G, the deeper the etching amount that is obtained in the etching process. For example, in an embodiment in which the focal point FP of the laser beam LB is formed at the first focal point FP1 located at the first focal depth a1 from the first short surface SS1a towards the lower side in the third direction Z, the corresponding region may be etched from the first short surface SS1a towards the lower side in the third direction Z, up to the first point SP1 having the second depth t2. In addition, when the focal point FP of the laser beam LB is formed at a second focal point FP2 located at a second focal depth a2 greater than the first focal depth a1 from the first short surface SS1a towards the lower side in the third direction Z, the corresponding region may be etched from the first short surface SS1a towards the lower side in the third direction Z, up to the second point SP2 having a third depth t3 greater than the second depth t2.

In an embodiment, the second focal point FP2 may be further from the non-processing area NPA (e.g., in the Y direction) than the first focal point FP1, and the second focal depth a2 which is a penetration depth of the second focal point FP2 in the substrate G may be greater than the first focal depth a1 which is a penetration depth of the first focal point FP1 in the substrate G. For example, in an embodiment, in the processing area PA, the penetration depth of the focal point FP may increase as a distance from the non-processing area NPA (e.g., in the X and/or Y directions) increases.

Figure 10:
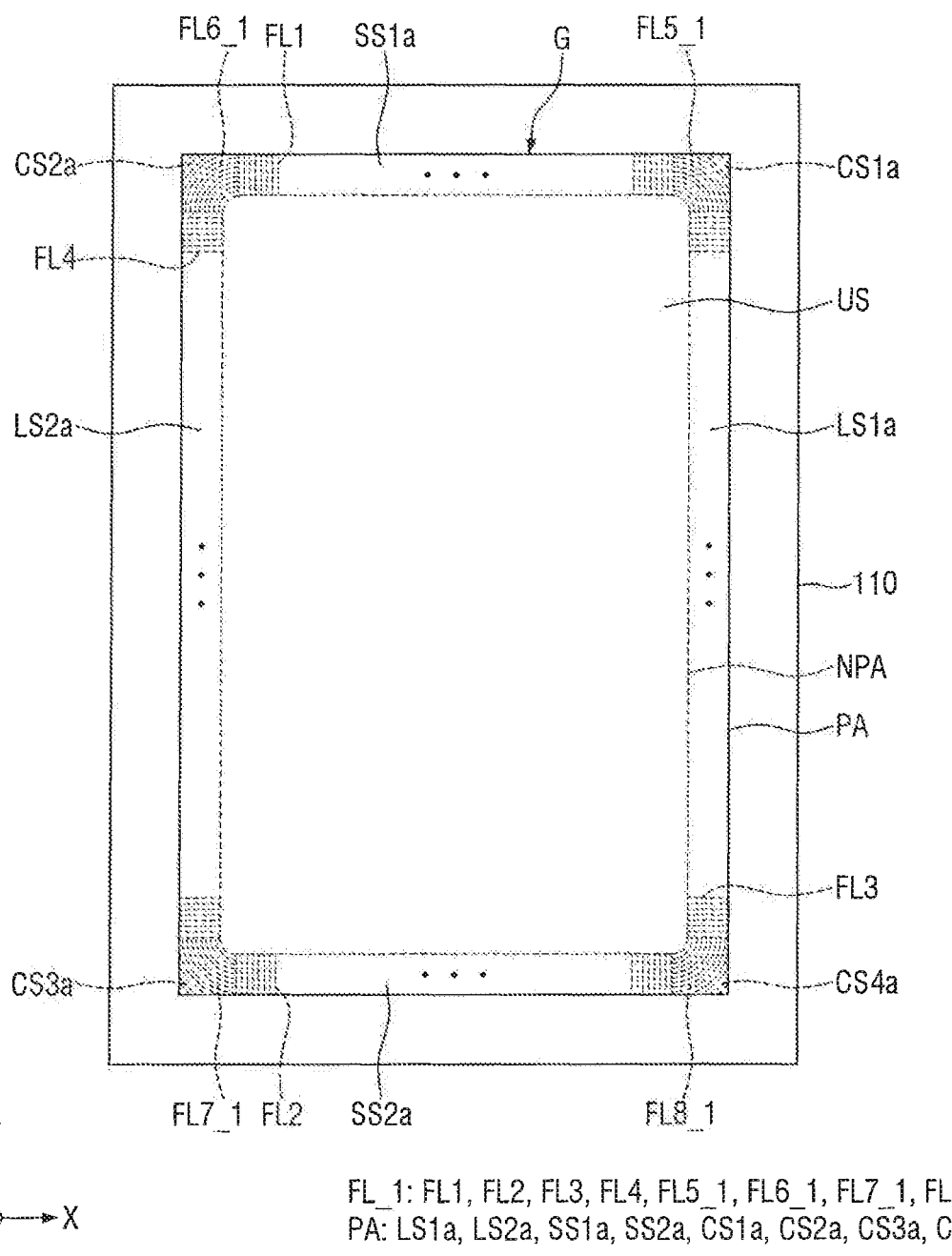
FIG. 10 is a plan view of a substrate to which a laser beam is irradiated through the laser irradiation apparatus according to an embodiment of the present disclosure.

FIG. 10 is a plan view of a substrate to which a laser beam is irradiated through the laser irradiation apparatus according to an embodiment.

Referring to FIG. 10, the laser beam LB irradiated onto the first to fourth corner surfaces CS1a, CS2a, CS3a, and CS4a of the substrate G may be irradiated in a direction different from that of FIG. 8. In an embodiment, shapes of the fifth to eight irradiation lines FL5_1, FL6_1, FL7_1 and FL8_1 may be different from those of FIG. 8. For example, in an embodiment, the controller 130 may control the laser beam LB which is irradiated onto the first to fourth corner surfaces CS1a, CS2a, CS3a, and CS4a to be irradiated along the fifth to eighth irradiation lines FL5_1, FL6_1, FL7_1, and FL8_1 which are different from those shown in FIG. 8.

The fifth irradiation line FL5_1 may be provided in plural. Each of the fifth irradiation lines FL5_1 may be aligned in a direction between a first side in the first direction X and a first side in the second direction Y. Each of the fifth irradiation lines FL5_1 may have a shape of an arc having a central angle that is a right angle. However, embodiments of the present disclosure are not limited thereto. The shape of each of the fifth irradiation lines FL5_1 may be substantially the same as the shape of the corner of the first surface US located in the direction between a first side in the first direction X and a first side in the second direction Y. In an embodiment, one side of at least some of the plurality of fifth irradiation lines FL5_1 may be in direct contact with the first short surface SS1a and the other side thereof may be in direct contact with the first long surface LS1a.

The sixth irradiation line FL6_1 may be provided in plural. Each of the sixth irradiation lines FL6_1 may be aligned in the direction between a second side in the first direction X and a first side of the second direction Y. Each of the sixth irradiation lines FL6_1 may have a shape of an arc having a central angle that is a right angle. However, embodiments of the present disclosure are not limited thereto. The shape of each of the sixth irradiation lines FL6_1 may be substantially the same as the shape of the corner of the first surface US located in the direction between the second side of the first direction X and the first side of the second direction Y. One side of at least some of the plurality of sixth irradiation lines FL6_1 may be in direct contact with the first short surface SS1a and the other side thereof may be in direct contact with the second long surface LS2a.

The seventh irradiation line FL7_1 may be provided in plural. Each of the seventh irradiation lines FL7_1 may be aligned in a direction between the second side in the first direction X and the second side in the second direction Y. Each of the seventh irradiation lines FL7_1 may have a shape of an arc having a central angle that is a right angle. However, embodiments of the present disclosure are not limited thereto. The shape of each of the seventh irradiation lines FL7_1 may be substantially the same as the shape of the corner of the first surface US located in the direction between the second side in the first direction X and the second side in the second direction Y. One side of at least some of the plurality of seventh irradiation lines FL7_1 may be in direct contact with the second short surface SS2a and the other side thereof may be in direct contact with the second long surface LS2a.

The eighth irradiation line FL8_1 may be provided in plural. Each of the eighth irradiation lines FL8_1 may be aligned in a direction between a first side of the first direction X and the second side of the second direction Y. Each of the eighth irradiation lines FL8_1 may have a shape of an arc having a central angle that is a right angle. However, embodiments of the present disclosure are not limited thereto. The shape of each of the eighth irradiation lines FL8_1 may be substantially the same as the shape of the corner of the first surface US located in the direction between the first side in the first direction X and the second side of the second direction Y. One side of at least some of the plurality of eighth irradiation lines FL8_1 may be in direct contact with the second short surface SS2a and the other side thereof may be in direct contact with the first long surface LS1a.

Figure 11:
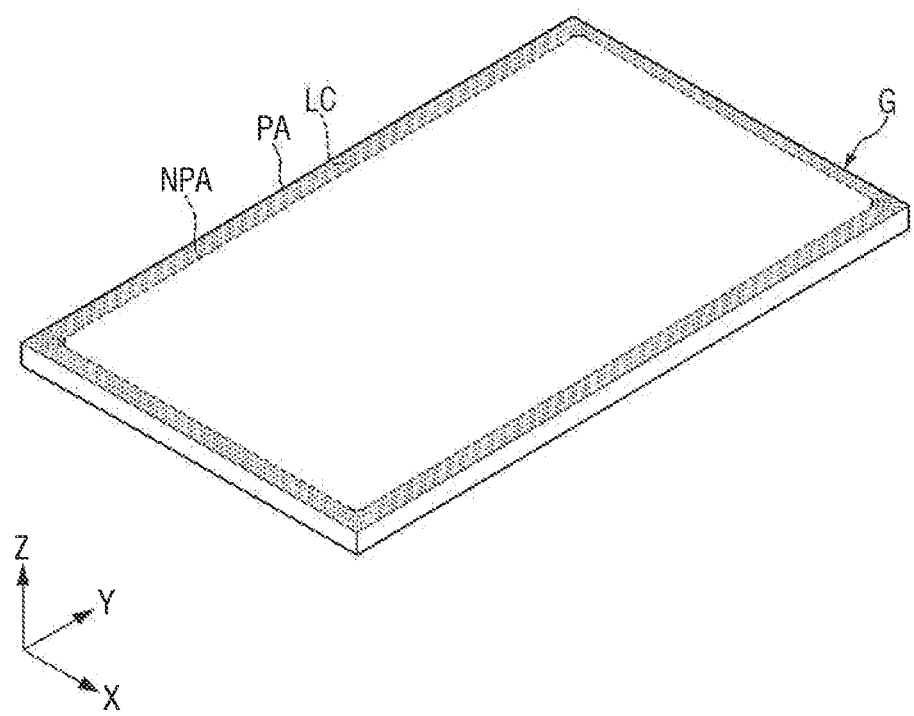
FIG. 11 is a perspective view illustrating a substrate on which a laser irradiation process is performed according to an embodiment of the present disclosure.
Figure 12:
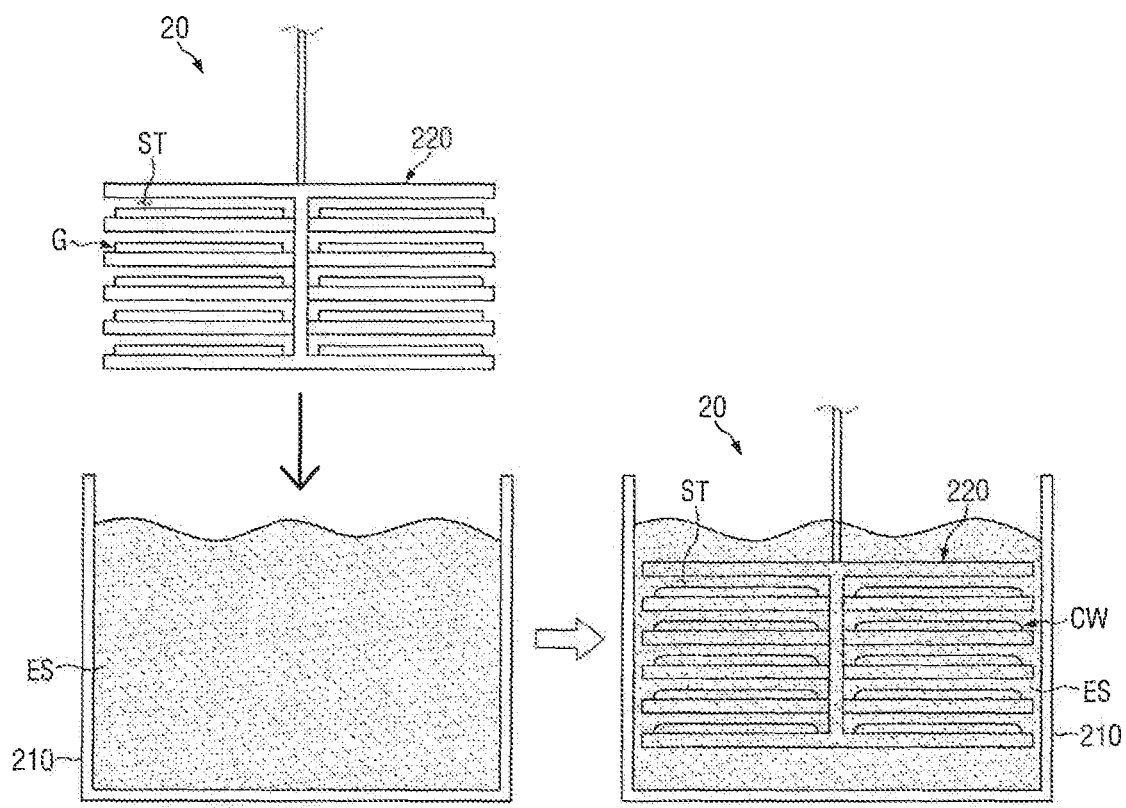
FIG. 12 is a cross-sectional view of a process of etching a substrate by using an etching apparatus included in a cover window manufacturing system according to an embodiment of the present disclosure.

FIG. 11 is a perspective view illustrating a substrate on which a laser irradiation process is performed. FIG. 12 is a schematic view of a process of etching a substrate by using an etching apparatus included in a cover window manufacturing system according to an embodiment.

Referring to FIGS. 11 and 12, when the laser irradiation process is completed, the fine crack LC may be formed in the processing area PA of the substrate G. In an embodiment, the fine crack LC may have a size that is observable by naked eyes. However, embodiments of the present disclosure are not limited thereto and the fine crack LC may have a size that is not observable by naked eyes.

The substrate G on which a laser irradiation process is completed may be loaded on the substrate carrier 220. For example, in an embodiment, the substrate carrier 220 may include a plurality of storage spaces ST and the substrate G on which a laser irradiation process is completed may be loaded on one of the storage spaces ST of the substrate carrier 220. The etching solution ES may be accommodated in the chamber 210. For example, the chamber 210 may be at least partially filled with the etching solution ES.

The substrate carrier 220 on which the substrates G are loaded may be immersed in the etching solution ES in the chamber 210. For example, the substrate G on which the performance of the laser irradiation process is completed may be loaded on the substrate carrier 220 and then immersed in the etching solution ES.

As described above, after the etching process is completed, the processing area PA to which the laser beam LB is irradiated in the substrate G may be etched more than the non-processing area NPA to which the laser beam LB has not been irradiated. In addition, as the focal point FP of the laser beam LB in the processing area PA is located deeper into the substrate G, the etching amount that is obtained may be greater.

The etching amount of the substrate G may also vary depending on components of the etching solution ES, concentration, etching process time, or an irradiation interval of the laser beam LB. This will be described later with reference to FIGS. 13 to 15.

Figure 13:
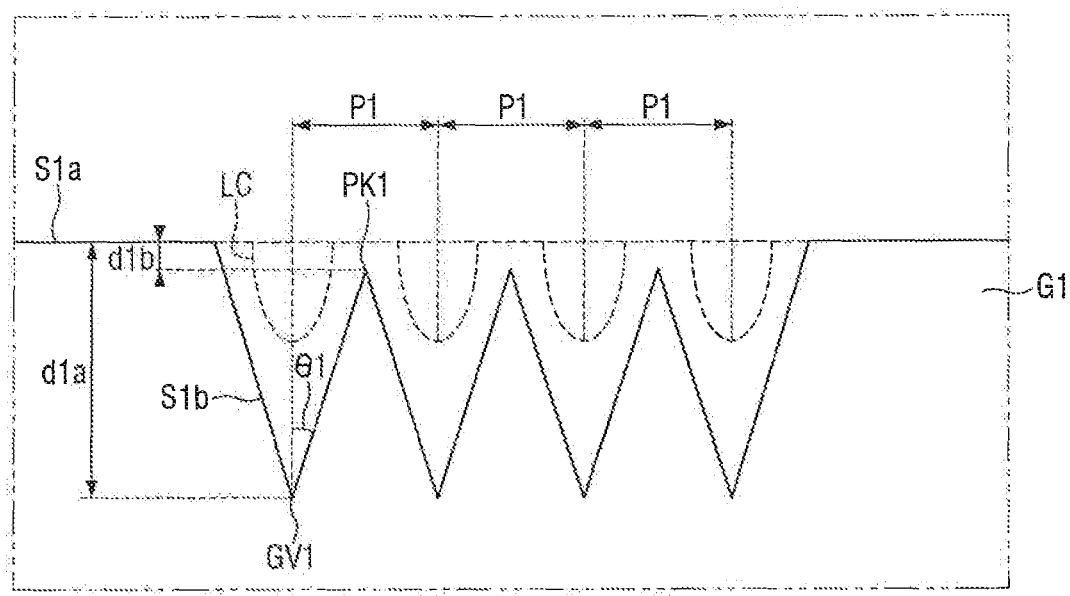
FIGS. 13 to 15 are cross-sectional views illustrating a surface of a cover window which changes according to a processing condition according to embodiments of the present disclosure.
Figure 14:
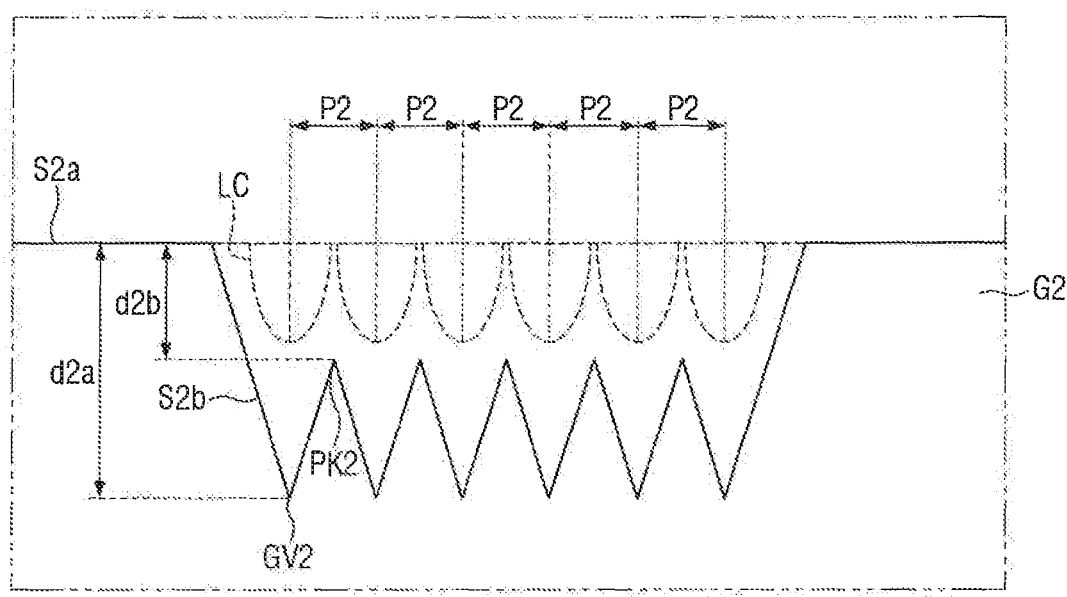
Figure 15:
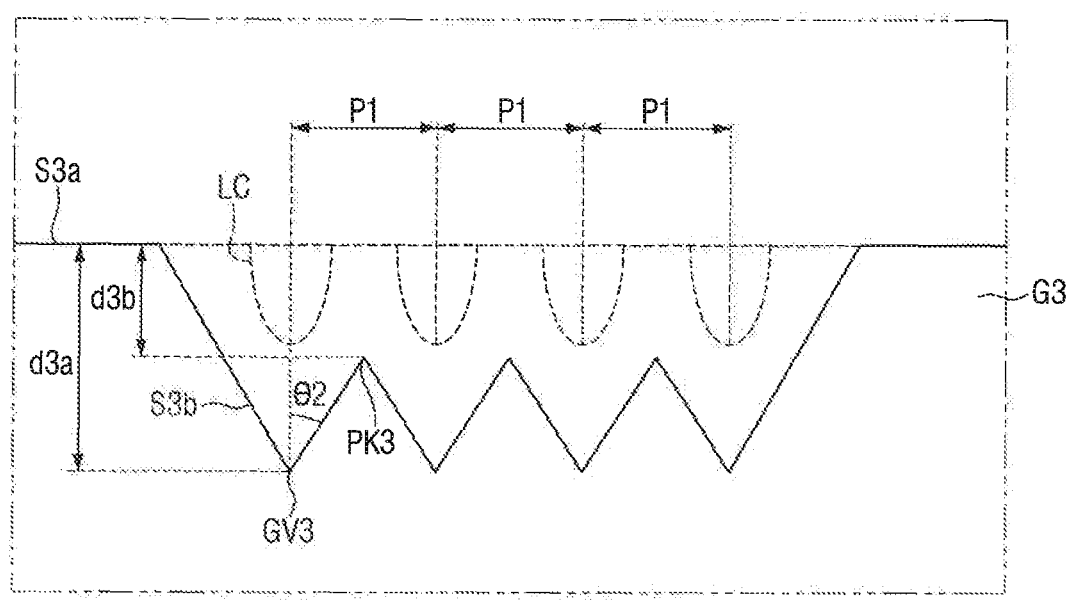

FIGS. 13 to 15 are schematic views illustrating a surface of a cover window which changes according to a processing condition.

The surface of the cover window CW may vary depending on the irradiation interval of the laser beam LB, components of the etching solution ES, concentration, and etching process time. In an embodiment in which processing is performed by setting the irradiation interval of the laser beam LB as a manipulation variable and keeping other conditions the same, a surface change of the cover window CW will be described with reference to FIGS. 13 and 14. In an embodiment in which processing is performed by setting components of the etching solution ES, concentration, and etching process time as manipulation variables and keeping other conditions the same, a surface change of the cover window CW will be described in reference to FIGS. 13 and 15.

Referring to FIG. 13, the laser beam LB according to an embodiment may be uniformly irradiated with a first interval P1 on a first substrate G1. In this embodiment, a plurality of fine cracks LC may be formed on one surface of the first substrate G1 to have the first interval P1. Referring to FIG. 14, in an embodiment, the laser beam LB may be uniformly irradiated onto a second substrate G2 with a second interval P2 which is less than the first interval P1. In this embodiment, a plurality of fine cracks LC may be formed on one surface of the second substrate G2 to have the second interval P2.

The number of irradiations of the laser beam LB per unit length may be greater in the second substrate G2 than in the first substrate G1.

After the laser beam LB is irradiated, the first substrate G1 and the second substrate G2 may be immersed in the etching solution ES to be etched.

The first substrate G1 may include a first flat surface S1a formed by etching the area to which the laser beam LB is not irradiated and a first recessed surface S1b formed by etching the area to which the laser beam LB is irradiated. The first flat surface S1a may include a flat surface. The first recessed surface S1b may have a shape recessed in a thickness direction compared to the first flat surface S1a. The first recessed surface S1b may include a plurality of first grooves GV1 and a plurality of first peaks PK1. The first groove GV1 may mean a point more recessed than the surroundings on the first recessed surface S1b, and the first peak PK1 may mean a point less recessed than the surroundings on the first recessed surface S1b. The first groove GV1 and the first peak PK1 may be alternately disposed. The first groove GV1 may be recessed from the first flat surface S1a by a first distance d1a. The first peak PK1 may be recessed by a second distance d1b which is less than the first distance d1a from the first flat surface S1a.

The second substrate G2 may include a second flat surface S2a formed by etching the area to which the laser beam LB is not irradiated and a second recessed surface S2b formed by etching the area to which the laser beam LB is irradiated. The second flat surface S2a may include a flat surface. The second recessed surface S2b may have a shape recessed in a thickness direction compared to the second flat surface S2a. The second recessed surface S2b may include a plurality of second grooves GV2 and a plurality of second peaks PK2. The second groove GV2 may mean a point more recessed than the surroundings on the second recessed surface S2b and the second peak PK2 may mean a point less recessed than the surroundings on the second recessed surface S2b. The second groove GV2 and the second peak PK2 may be alternately disposed. The number of the second grooves GV2 per unit length may be greater than the number of the first grooves GV1 per unit length. In addition, the number of the second peaks PK2 per unit length may be greater than the number of the first peaks PK1 per unit length. The second groove GV2 may be recessed from the second flat surface S2a by a third distance d2a which is greater than the first distance d1a. The second peak PK2 may be recessed from the second flat surface S2a by a fourth distance d2b which is less than the third distance d2a. The fourth distance d2b may be greater than the second distance d1b.

In an embodiment, the first substrate G1 and the second substrate G2 may be polished in a subsequent process. After the polishing process is carried out, a difference in etching amount between the area to which the laser beam LB is irradiated and the area to which the laser beam LB is not irradiated in the first substrate G1 may be less than a difference in etching amount between the area to which the laser beam LB is irradiated and the area to which the laser beam LB is not irradiated in the second substrate G2. For example, as the irradiation interval of the laser beam LB becomes narrower, the etching of the laser beam LB irradiation area may be more actively performed.

Referring to FIGS. 13 and 15, the etching amount may vary according to the size of the etching inclination angle that appears according to the condition of the etching solution ES.

In an embodiment, the laser beam LB may have the same first interval P1 as that of the first substrate G1 and be uniformly irradiated onto a third substrate G3. In this embodiment, the plurality of fine cracks LC may be formed on one surface of the third substrate G3 to have the first interval P1.

After the laser beam LB is irradiated, the first substrate G1 and the third substrate G3 may be immersed in the etching solution ES to be etched.

The third substrate G3 may include a third flat surface S3a formed by etching the area to which the laser beam LB is not irradiated and a third recessed surface S3b formed by etching the area to which the laser beam LB is irradiated. The third flat surface S3a may include a flat surface. The third recessed surface S3b may have a shape recessed in a thickness direction compared to the third flat surface S3a. The third recessed surface S3b may include a plurality of third grooves GV3 and a plurality of third peaks PK3. The third groove GV3 may mean a point more recessed than the surroundings on the third recessed surface S3b and the third peak PK3 may mean a point less recessed than the surroundings on the third recessed surface S3b. The third groove GV3 and the third peak PK3 may be alternately disposed. The third groove GV3 may be recessed from the third flat surface S3$a$ by a fifth distance d3$a$ which is greater than the first distance d1$a$. The third peak PK3 may be recessed from the third flat surface S3$a$ by a sixth distance d3$b$ which is less than the fifth distance d3$a$ and greater than the second distance d1$b$.

The first recessed surface S1$b$ of the first substrate G1 may have a first etching inclination angle $\theta 1$ in the first groove GV1. The first etching inclination angle $\theta 1$ may mean an angle formed by the first recessed surface S1$b$ with respect to a normal line drawn from the first groove GV1. The normal line drawn from the first groove GV1 may mean an imaginary line drawn from the first groove GV1 in a thickness direction of the first substrate G1.

The third recessed surface S3$b$ of the third substrate G3 may have a second etching inclination angle $\theta 2$ that is greater than the first etching inclination angle $\theta 1$ in the third groove GV3. The second etching inclination angle $\theta 2$ may mean an angle formed by the second recessed surface S2$b$ with respect to a normal line drawn from the third groove GV3. The normal line drawn from the third groove GV3 may mean an imaginary line drawn from the third groove GV3 in a thickness direction of the third substrate G3.

In an embodiment, the etching inclination angles $\theta 1$ and $\theta 2$ may be adjusted according to components of the etching solution ES, concentration and the etching process time. The etching inclination angle may decrease as the acidity is less, the concentration is less, and the etching process time is greater, and may increase as the acidity is greater, the concentration is greater, and the etching process time is less. For example, in the third substrate G3, compared to the first substrate G1, the acidity of the etching solution ES used for the etching process may be greater, the concentration may be greater, or the etching process time may be less. However, embodiments of the present disclosure are not limited thereto, and in the third substrate G3, the etching inclination angle may be increased by satisfying at least one of three conditions, compared to the first substrate G1.

In an embodiment, the first substrate G1 and the second substrate G2 may be polished in a subsequent process. After the polishing process is carried out, a difference in etching amount between the area to which the laser beam LB is irradiated and the area to which the laser beam LB is not irradiated in the first substrate G1 may be less than a difference in etching amount between the area to which the laser beam LB is irradiated and the area to which the laser beam LB is not irradiated in the second substrate G2. For example, as the irradiation interval of the laser beam LB becomes narrower, the etching may be more actively performed by the laser beam LB irradiation.

In an embodiment, the first substrate G1 and the third substrate G3 may be polished in a subsequent process. After the polishing process is carried out, a difference in etching amount between the area to which the laser beam LB is irradiated and the area to which the laser beam LB is not irradiated in the first substrate G1 may be less than a difference in etching amount between the area to which the laser beam LB is irradiated and the area to which the laser beam LB is not irradiated in the third substrate G3. For example, the etching of the laser beam LB irradiation area may be more actively performed as etching is performed under the condition that the etching inclination angle is large, for example, when the acidity of the etching solution ES used for the etching process is strong, when the concentration is high, or when the etching process time is short.

The cover window manufacturing system 1 according to an embodiment may reduce the defect rate in manufacturing the cover window CW through an increase in the precision of the processing. In addition, the cover window manufacturing system 1 according to an embodiment may reduce the manufacturing cost of the cover window CW by processing the cover window CW using a simplified processing method.

In an embodiment, the cover window manufacturing system 1 according to an embodiment may perform more precise processing by adjusting the irradiation interval of the laser beam LB, components and concentration of the etching solution ES, etching process time and the like.

Figure 16:
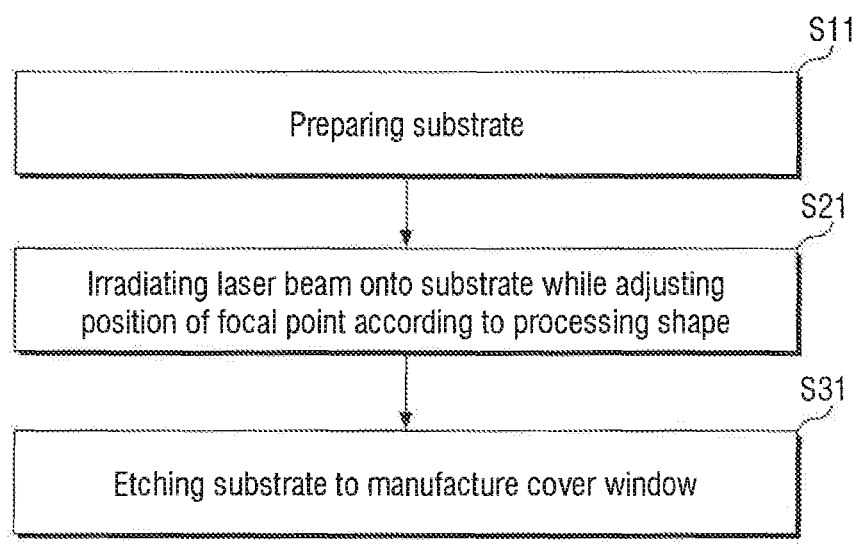
FIG. 16 is a flowchart showing a method for manufacturing a cover window according to an embodiment of the present disclosure.

FIG. 16 is a flowchart showing a method for manufacturing a cover window according to an embodiment.

Referring to FIGS. 7 to 12 and 16, the manufacturing method of the cover window according to an embodiment may include preparing a substrate in block S11, irradiating a laser beam onto the substrate while adjusting the position of a focal point according to a processing shape in block S21 and etching the substrate to manufacture the cover window in block S31.

The substrate G may be prepared in block S11. In an embodiment, the substrate G may have a rectangular parallelepiped shape as shown in FIG. 7. However, embodiments of the present disclosure are not limited thereto and the substrate G may have various different shapes. In an embodiment, the substrate G may be made of glass.

The laser beam LB may then be irradiated onto the substrate G while adjusting the position of the focal point FP according to the processing shape in block S21. As illustrated in FIG. 8 or FIG. 10, the laser beam LB may be irradiated along the first to eighth irradiation lines FL1, FL2, FL3, FL4, FL5, FL6, FL7, and FL8 while adjusting the position of the focal point FP of the laser beam LB according to a desired processing shape on a plane formed by the first direction X and the second direction Y. Also, as illustrated in FIG. 9, when irradiating the laser beam LB, the position of the focal point FP of the laser beam LB in the third direction Z may be modified to adjust the etching amount in the third direction Z. For example, when the laser beam LB is irradiated from one side of the substrate G in the third direction Z, the etching amount obtained in the subsequent etching process may be greater as the focal point FP is located closer to the lower side in the third direction Z of the substrate G.

In addition, referring to FIGS. 13 and 14, more etching may be performed through a subsequent etching process as the irradiation interval of the laser beam LB becomes narrower, and less etching may be performed through the subsequent etching process as the irradiation interval of the laser beam LB becomes wider. For example, the etching amount of the substrate G may be adjusted by modifying the irradiation interval of the laser beam LB.

When the laser beam LB irradiation process is completed on the substrate G, the fine crack LC may be formed in the processing area PA of the substrate G as illustrated in FIG. 11. Although the shape of the fine crack LC is illustrated to be the same for each area within the processing area PA in FIG. 11, the shape may be different for each area, such as according to the position of the focal point FP of the irradiated laser beam LB in the third direction Z.

The substrate G may be etched to manufacture the cover window CW in block S31. For example, the substrate G on which the laser beam LB irradiation process illustrated in FIG. 11 is completed may be immersed in the etching solution ES to be etched. At this time, the etching inclination angle of the substrate G may be adjusted according to components of the etching solution ES, concentration and etching process time. In an embodiment, the etching inclination angle may decrease as the acidity is lower, the concentration is lower, and the etching process time is greater, and may increase as the acidity is greater, the concentration is greater, and the etching process time is less.

Referring to FIGS. 13 and 15, when the etching process is performed under the condition that the etching inclination angle is large, the difference in etching amount between the non-processing area NPA and the processing area PA of the substrate G may increase. For example, when the etching process is performed under the condition that the etching inclination angle is relatively large, the effect of increasing the etching amount by the laser beam LB irradiation may further increase. On the contrary, when the etching process is performed under the condition that the etching inclination angle is relatively small, the effect of increasing the etching amount by the laser beam LB irradiation may decrease.

The method for manufacturing the cover window CW according to an embodiment may reduce the defect rate in manufacturing the cover window CW through an increase in the precision of the processing. In addition, the method for manufacturing the cover window CW according to an embodiment may reduce the manufacturing cost of the cover window CW by processing the cover window CW using a simplified processing method.

The method for manufacturing the cover window CW according to an embodiment may perform more precise processing by adjusting the irradiation interval of the laser beam LB, components and concentration of the etching solution ES, the etching process time and the like.

Hereinafter, an embodiment of the cover window manufacturing system 1 will be described. Description of the cover window manufacturing system 1 according to this embodiment will be given below by omitting redundant parts of the description of the cover window manufacturing system 1 according to an embodiment and focusing on differences.

Figure 17:
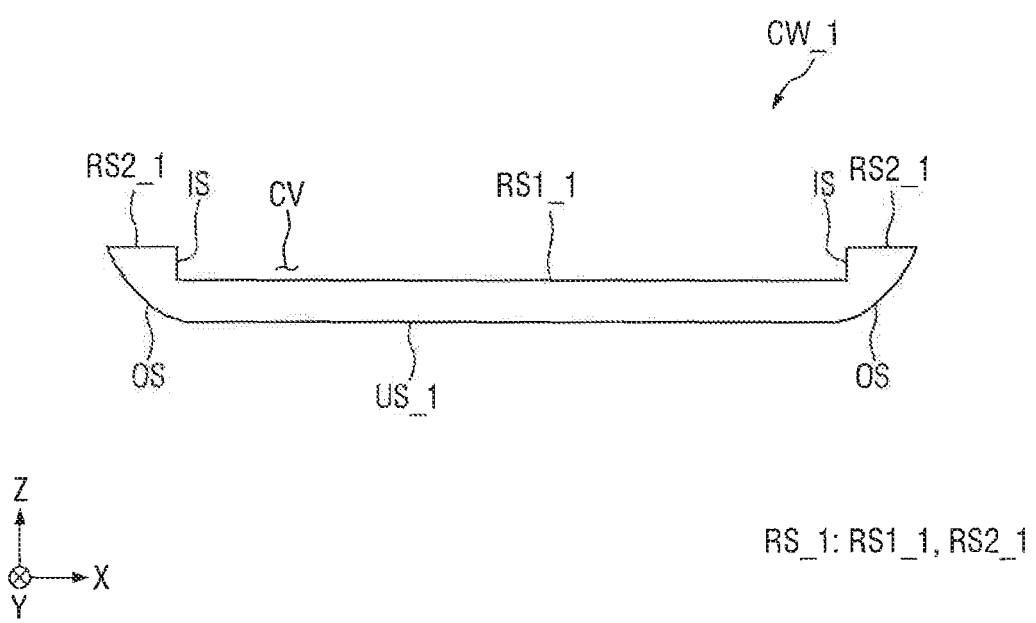
FIG. 17 is a cross-sectional view illustrating a cover window according to an embodiment of the present disclosure.
Figure 18:
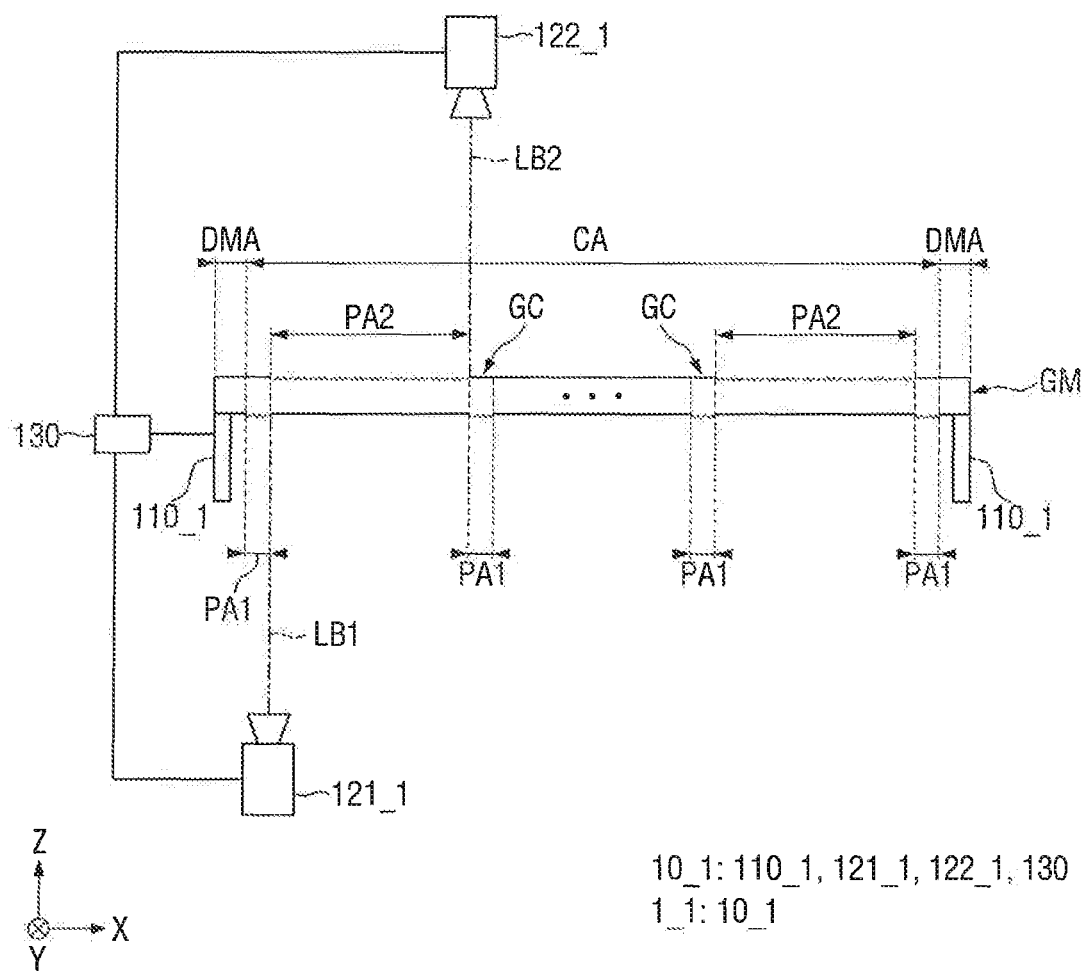
FIG. 18 is a cross-sectional view illustrating a laser irradiation apparatus according to an embodiment for manufacturing the cover window of FIG. 17.
Figure 19:
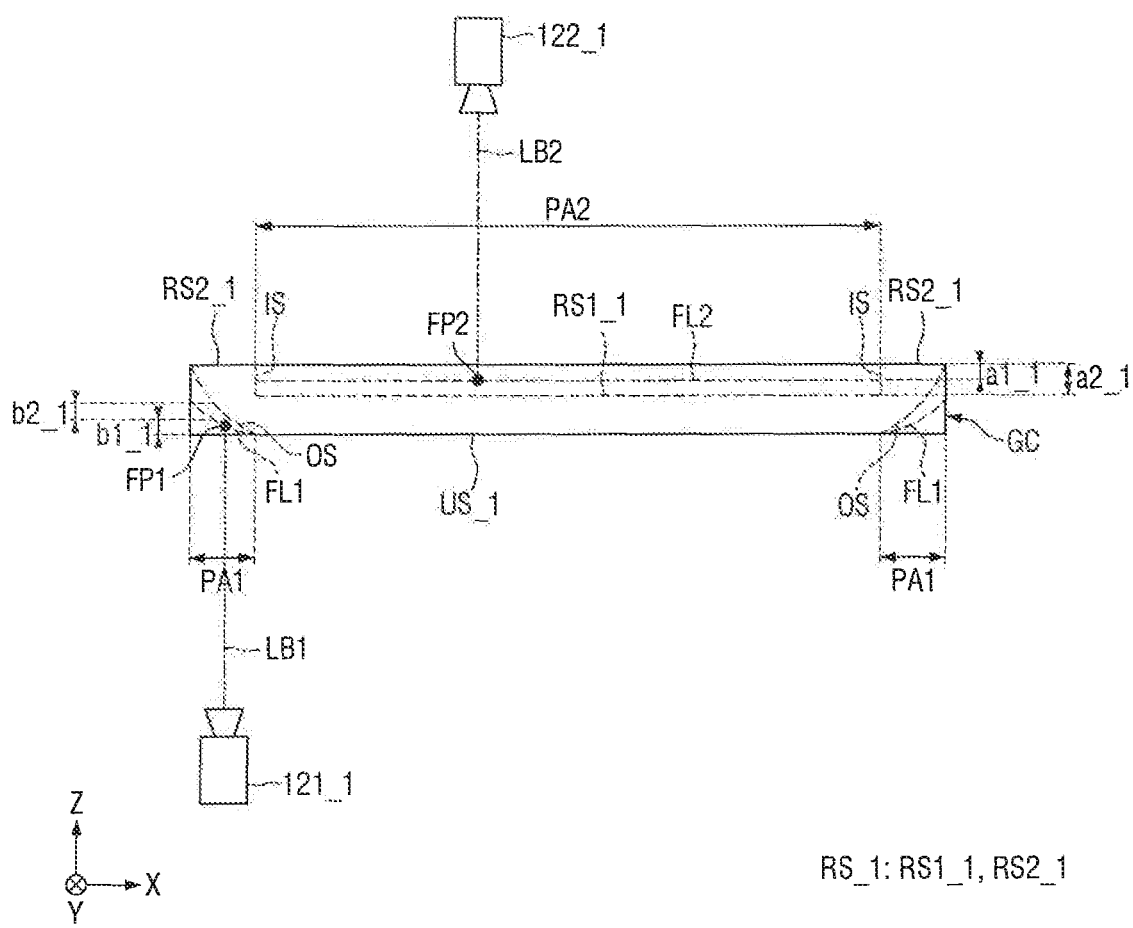
FIG. 19 is a cross-sectional view illustrating a cover window manufacturing process performed through a cover window manufacturing system according to an embodiment of the present disclosure.

FIG. 17 is a cross-sectional view illustrating a cover window according to an embodiment. FIG. 18 is a schematic view illustrating a laser irradiation apparatus according to an embodiment for manufacturing the cover window of FIG. 17. FIG. 19 is a schematic view illustrating a cover window manufacturing process performed through a cover window manufacturing system according to an embodiment.

Referring to FIGS. 17 to 19, a cover window manufacturing system 1_1 according to an embodiment is different from the cover window manufacturing system 1 according to an embodiment shown in FIG. 5 in that it includes a laser irradiation apparatus 10_1 having a different structure.

The cover window manufacturing system 1_1 according to an embodiment may be used in manufacturing a cover window CW_1 illustrated in FIG. 17. The cover window CW_1 illustrated in FIG. 17 will be described first and then the cover window manufacturing system 1_1 according to an embodiment will be described.

In an embodiment, the cover window CW_1 may include a first surface US_1, a second surface RS_1 which is the opposite surface of the first surface US_1 and a curved outer side surface OS disposed to surround the first surface US_1 (e.g., in the X and Y directions). The second surface RS_1 may include a second inner surface RS1_1 and a second outer surface RS2_1 surrounding the second inner surface RS1_1. The second inner surface RS1_1 may be more recessed towards the first surface US_1 than the second outer surface RS2_1. The second inner surface RS1_1 may include a flat surface and may be substantially parallel to the first surface US_1. A step may be formed between the second inner surface RS1_1 and the second outer surface RS2_1. The cover window CW_1 may further include an inner side surface IS disposed between the second inner surface RS1_1 and the second outer surface RS2_1 to connect the second inner surface RS1_1 and the second outer surface RS2_1. In addition, the outer side surface OS may connect the second outer surface RS2_1 and the first surface US_1. The cover window CW_1 may include a cavity CV which is a space defined by the second inner surface RS1_1 and the inner side surface IS.

In the cover window manufacturing system 1_1 according to an embodiment, after irradiating a first laser beam LB1 and a second laser beam LB2 to upper and lower portions of a parent substrate GM having a rectangular parallelepiped shape, the cover window CW_1 including the outer side surface OS and the cavity CV may be manufactured through a subsequent etching process.

The cover window manufacturing system 1_1 according to an embodiment may include a stage 110_1, a first laser module 121_1 disposed below the stage 110_1, a second laser module 122_1 disposed above the stage 1101 and the controller 130 which controls the first and second laser modules 121_1 and 122_1.

The parent substrate GM may be mounted on (e.g., disposed on) the stage 110_1. In an embodiment, the parent substrate GM may include a cell area CA that is changed to a cover window CW_1 as shown in FIG. 17 through a subsequent process and a dummy area DMA disposed around the cell area CA (e.g., in the X and/or Y directions). In an embodiment, for example, the dummy area DMA may be disposed to surround the cell area CA (e.g., in the X and/or Y directions). The stage 1101 may be in direct contact with the dummy area DMA of the parent substrate GM and support the parent substrate GM. For example, both the top surface and the bottom surface of the cell area CA of the parent substrate GM may be exposed. However, embodiments of the present disclosure are not limited thereto, and the stage 110_1 may be in direct contact with various areas where neither the first laser beam LB1 nor the second laser beam LB2 is irradiated in the cell area CA of the parent substrate GM and may support the parent substrate GM.

In an embodiment, the cell area CA of the parent substrate GM may include a plurality of cell substrates GC. Each of the cell substrates GC may include a first processing area PA1 and a second processing area PA2. FIG. 18 illustrates the cell substrate GC in which the first processing area PA1 and the second processing area PA2 do not overlap each other, such as in a thickness direction of the cell substrate GC (e.g., in the Z direction). However, embodiments of the present disclosure are not limited thereto, and the first processing area PA1 and the second processing area PA2 may partially overlap each other in the cell substrate GC in a thickness direction of the cell substrate GC (e.g., in the Z direction). In addition, in an embodiment, the first processing area PA1 and the second processing area PA2 may not overlap each other (e.g., in the Z direction) but the cell substrate GC may further include a non-processing area disposed between the first processing area PA1 and the second processing area PA2.

The first laser beam LB1 may be irradiated to the first processing area PA1 of the cell substrate GC from the first laser module 1211 along the first irradiation line FL1. The first irradiation line FL1 may be a line through which the first focal point FP1 of the first laser beam LB1 passes in the first processing area PA1 when the first laser beam LB1 is irradiated. The position of the first irradiation line FL1 in the third direction Z may move to one side in the third direction Z as it goes toward the outside of the cell substrate CG. The first processing area PA1 of the cell substrate GC may become an area on which the outer side surface OS of the cover window CW_1 is formed through a subsequent etching process. In the first processing area PA1, a penetration depth b1_1 of the first focal point FP1 of the first laser beam LB1 in the third direction Z may be less than an etching depth b2_1 in the third direction Z in a subsequent etching process.

In the second processing area PA2 of the cell substrate GC, the second laser beam LB2 may be irradiated from the second laser module 1221 along the second irradiation line FL2. The second irradiation line FL2 may be a line through which the second focal point FP2 of the second laser beam LB2 passes in the second processing area PA2 when the second laser beam LB2 is irradiated. In an embodiment, the position of the second irradiation line FL2 in the third direction Z may be maintained constant. For example, the position of the second irradiation line FL2 in the third direction Z may be maintained constant, but only positions in the first direction X and the second direction Y may be changed. The second processing area PA2 of the cell substrate GC may be an area in which the cavity CV of the cover window CW_1 is formed through a subsequent etching process. For example, the second processing area PA2 may be an area on which the second inner surface RS1_1 is formed. In the second processing area PA2, a penetration depth a1_1 of the focal point FP of the laser beam LB in the third direction Z may be less than an etching depth a2_1 in the third direction Z in a subsequent etching process. However, embodiments of the present disclosure are not limited thereto. For example, in an embodiment, the position of the first irradiation line FL1 in the third direction Z may be maintained constant and only positions in the first direction X and the second direction Y may be changed whereas the position of the second irradiation line FL2 in the third direction Z may move to one side in the third direction Z as it goes toward the outside of the cell substrate CG.

The cover window manufacturing system 1_1 according to an embodiment may reduce the defect rate in manufacturing the cover window CW_1 through an increase in the precision of the processing. In addition, the cover window manufacturing system 1_1 according to an embodiment may reduce the manufacturing cost of the cover window CW_1 by processing the cover window CW_1 using a simplified processing method. In addition, the cover window manufacturing system 1_1 according to an embodiment may perform more precise processing by adjusting the irradiation interval of the laser beam LB, components and concentration of the etching solution ES, the etching process time and the like.

Moreover, the cover window manufacturing system 1_1 according to an embodiment may manufacture the cover window CW_1 having various three-dimensional structures through a simplified process by simultaneously irradiating the laser beam LB from above and below.

Although embodiments of the present disclosure have been disclosed for illustrative purposes, those skilled in the art will appreciate that various modifications, additions and substitutions are possible, without departing from the scope and spirit of the present disclosure as disclosed in the accompanying claims.

What is claimed is:

1. A method for manufacturing a cover window, comprising:
preparing a substrate;
irradiating a laser beam on the substrate while adjusting a position of a focal point of the laser beam on the substrate according to a processing shape; and
etching the substrate irradiated by the laser beam,
wherein an etching depth of the substrate in a thickness direction of the substrate is greater than a penetration depth of the laser beam irradiated on the substrate in the thickness direction of the substrate, and
wherein the penetration depth of the laser beam continually increases in the thickness direction of the substrate as the laser beam moves along an irradiation line extending in a plan view.

2. The method of claim 1, wherein a position of the focal point of the laser beam is controlled in a thickness direction of the substrate.

3. The method of claim 1, wherein:
the substrate includes a processing area on which the laser beam is irradiated and a non-processing area on which the laser beam is not irradiated; and
a thickness of the processing area is less than a thickness of the non-processing area after the substrate is etched.

4. The method of claim 3, wherein:
the processing area includes a first side surface extending in a first direction, a second side surface extending in a second direction crossing the first direction, and a corner surface disposed between the first side surface and the second side surface; and
the laser beam is irradiated while moving in the second direction on the first side surface, the laser beam is irradiated while moving in the first direction on the second side surface, and the laser beam is irradiated while moving in a third direction different from the first direction and the second direction on the corner surface.

5. The method of claim 3, wherein in the irradiating of the laser beam, when an irradiation interval of the laser beam decreases, a difference between an etching amount of the processing area and an etching amount of the non-processing area increases after the substrate is etched.

6. The method of claim 3, wherein:
the etching of the substrate is performed by immersing the substrate in an etching solution; and
when an acidity of the etching solution increases, a difference between an etching amount of the processing area and an etching amount of the non-processing area increases after the substrate is etched.

7. The method of claim 3, wherein an outer edge of the processing area is positioned at an outer edge of the substrate.

8. A method for manufacturing a cover window, comprising:
preparing a substrate;
irradiating a laser beam on the substrate while adjusting a position of a focal point of the laser beam on the substrate according to a processing shape; and
etching the substrate irradiated by the laser beam,
wherein an etching depth of the substrate in a thickness direction of the substrate is greater than a penetration depth of the laser beam irradiated on the substrate in the thickness direction of the substrate,
wherein:
the substrate includes a processing area on which the laser beam is irradiated and a non-processing area on which the laser beam is not irradiated; and
a thickness of the processing area is less than a thickness of the non-processing area after the substrate is etched,
wherein:

the processing area is arranged to surround the non-processing area the penetration depth of the focal point of the laser beam increases in the processing area as a distance from the non-processing area increases.

9. A method for manufacturing a cover window, comprising:

preparing a substrate;

irradiating a laser beam on the substrate while adjusting a position of a focal point of the laser beam on the substrate according to a processing shape; and etching the substrate irradiated by the laser beam, wherein an etching depth of the substrate in a thickness direction of the substrate is greater than a penetration depth of the laser beam irradiated on the substrate in the thickness direction of the substrate, wherein an outer edge of the processing area is positioned at an outer edge of the substrate, wherein the penetration depth of the focal point of the laser beam continually increases from a portion of the processing area closest to the non-processing area to the outer edge of the substrate.

\* \* \* \* \*